(12) United States Patent
Thaler et al.

(10) Patent No.: US 6,471,805 B1
(45) Date of Patent: Oct. 29, 2002

(54) METHOD OF FORMING METAL CONTACT PADS ON A METAL SUPPORT SUBSTRATE

(75) Inventors: Barry Jay Thaler, Lawrenceville; Ashok Narayan Prabhu, East Windsor, both of NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 09/434,058

(22) Filed: Nov. 4, 1999

Related U.S. Application Data
(60) Provisional application No. 60/107,211, filed on Nov. 5, 1998.

(51) Int. Cl.⁷ .............................................. C03B 29/00
(52) U.S. Cl. ...................... 156/89.12; 29/830; 29/846; 65/42; 156/89.16; 156/89.17; 264/614; 264/619
(58) Field of Search .............................. 65/42; 29/830, 29/846; 156/89.12, 89.16, 89.17; 264/614, 619

(56) References Cited

U.S. PATENT DOCUMENTS

| | | | | |
|---|---|---|---|---|
| 3,423,517 A | * | 1/1969 | Anrhenius | 174/256 |
| 3,458,930 A | * | 8/1969 | Melkeraaen et al. | 29/848 |
| 3,520,054 A | * | 7/1970 | Pensack et al. | 29/830 |
| 5,514,451 A | | 5/1996 | Kumar et al. | 428/210 |
| 5,565,262 A | | 10/1996 | Azzaro et al. | 428/219 |
| 5,581,876 A | | 12/1996 | Prabhu et al. | 29/851 |
| 5,653,834 A | * | 8/1997 | Azzaro et a. | 427/97 |
| 5,688,146 A | * | 11/1997 | McGinley et al. | 439/637 |
| 5,725,808 A | | 3/1998 | Tormey et al. | 252/514 |
| 5,866,240 A | | 2/1999 | Prabhu et al. | 428/210 |
| 6,018,299 A | * | 1/2000 | Eberhardt | 340/572.7 |

* cited by examiner

Primary Examiner—Sean Vincent
(74) Attorney, Agent, or Firm—William J. Burke

(57) ABSTRACT

A method of forming low resistance contact pads on a metal support substrate for a multilayer ceramic printed circuit board comprising forming a patterned layer of a conductive metal on the metal support substrate made of the same metal as that used to form the circuitry on the ceramic circuit board, and firing the support substrate. The patterned conductive metal can be formed by electroplating, by screen printing from a fritless conductor ink or by screen printing from a glass frit-containing conductor ink that includes a reducing agent.

11 Claims, No Drawings

METHOD OF FORMING METAL CONTACT PADS ON A METAL SUPPORT SUBSTRATE

This application claims the priority of Thaler et al., "Formation of Electrical Contacts to the Metal Core for LTCC-M Substrates and Packages," Ser. No. 60/107,211, filed Nov. 5, 1998. +gi This invention was at least partially supported by the Government Contract No. DAAB07-94-C-C009 awarded by the Department of the Army. The government may have certain rights in this invention.

This invention relates to a method of forming contacts. More particularly, this invention relates to a method of forming contacts between a ceramic multilayer circuit board and a metal support substrate.

BACKGROUND OF THE INVENTION

Low temperature firing multilayer ceramic circuit boards are known that are suitable for use with low melt temperature conductive metals, such as silver, gold and copper. They have a low thermal coefficient of expansion (TCE) and they may be formulated to be compatible with both silicon and gallium arsenide devices.

These ceramic circuit boards are made from glasses that can be fired at low temperatures, e.g., temperatures of less than 1000° C. The circuit boards are made by admixing finely divided selected glass particles or powders, and optional inorganic fillers, with organic materials including resin, solvents, dispersants and the like. The resultant slurry is cast as a thin tape, called green tape. A circuit pattern may be screen printed onto the green tape using a conductor ink formulation comprising a conductive metal powder, an organic vehicle and a powdered glass, generally the same glass as that used to make the green tape.

A plurality of green tapes having printed circuits thereon can be stacked together. In such case, via holes are punched into the green tapes which are filled with a conductive via fill ink to provide electrical contact between the circuits on the various green tapes. The green tapes are then aligned, laminated under heat and pressure, and fired to remove the organic materials and to devitrify the glass.

Recently, multilayer ceramic circuits boards have been adhered to a metal support board for added mechanical strength. A bonding glass can be used to coat the metal support and to provide adhesion between the support and the laminated ceramic layers. An added advantage to this method is that the bonding glass reduces shrinkage of the green tapes in the x and y dimensions during firing. Thus most of the shrinkage occurs in the z, or thickness, dimension. The result is that tolerances between the circuits and the via holes can be reduced.

The glasses used to make the green tapes must have a TCE matched to that of the metal support to prevent delamination or cracking of the fired glass. The TCE of the green tapes can be modified by the addition to the green tape slurry of various inorganic fillers including metal oxides and metal powders.

The multilayer circuit boards are mounted on the metal support substrate and fired in air at temperatures between about 700 to 1000° C. This firing forms a thin oxidized dielectric layer on the metal support substrate, preventing good electrical contact between the metal support and the circuits on the multilayer ceramics.

Thus methods have been sought to form low resistance (1 ohm or less) contacts between the metal support substrate and a multilayer circuit board mounted thereon, and to prevent the formation of a dielectric layer on the support substrate that impedes the formation of low resistance contacts.

SUMMARY OF THE INVENTION

Metal support boards for supporting a multilayer ceramic circuit board can be processed to prevent formation of a dielectric layer between the metal support and the overlying multilayer ceramic circuit board having circuitry and vias formed of a low melt temperature conductive metal. A patterned layer of a conductive metal, such as silver and/or gold, is formed on the unfired metal support. When the low melt temperature conductive metal used in the ceramic circuit board is made of silver, the patterned layer, if made of gold, can be covered with silver, as by screen printing with a fritless silver ink. The resultant contact pads can be connected to the circuits made of the same metal on the multilayer ceramic board. A silver screen printable ink including a glass frit can be applied directly to the surface of the metal support. The contact pads are then fired.

Just prior to mounting the laminated multilayer circuit board to the metal support, a conductive metal thick film ink is applied to the contact pads. The conductive metal is chosen to match the metal of the circuits and via fill inks of the circuit board.

DETAILED DESCRIPTION OF THE INVENTION

The problem addressed herein is how to prevent formation of a dielectric layer on a metal support substrate which interferes with good electrical contact, i.e., to obtain less than 1 ohm resistance, between the metal support substrate and a multilayer ceramic circuit board.

Depending upon the metal chosen for the metal support, which can include copper clad molybdenum, copper clad Kovar®, an alloy of iron, nickel, cobalt and manganese supplied by Carpenter Technology, titanium and the like, the ceramic is chosen so that it has a TCE match to the metal support. Various glasses and ceramic mixtures are known that have a TCE match to various metal support substrates.

The present invention will be illustrated using a nickel plated copper clad molybdenum support substrate, and printed circuits utilizing silver circuitry and silver via fill inks, but the invention is not meant to be limited thereto.

In accordance with the invention, several methods can be used to apply one or more contact pads onto the metal support board so that no dielectric layer is formed on the metal support substrate during the various known steps for assembling the various printed circuits. Such ceramic circuits can include embedded devices such as capacitors and resistors for example. In all cases, the metal support must be cleaned so as to be free of dielectric materials on the surface of the support.

Silver contact pads can be made using a two step method which includes first electrolytically depositing a soft gold layer, such as from a plating bath supplied as Technic Orotemp 24 by Technic Inc. The plating bath can be used with a mask layer on the support substrate, thereby depositing a patterned gold layer thereon directly, and then removing the mask layer. Alternatively an unpatterned gold layer can be deposited from the plating bath and the metal layer etched back through a mask to remove the unwanted gold. A patterned gold layer is thus formed with gold pads where future electrical connections are to be made.

A fritless silver thick film ink is then applied by screen printing so as to form silver pads over the gold pads.

Generally, the silver pads should be slightly larger than the underlying gold pads, again to prevent formation of a dielectric layer during the subsequent firing step.

The patterned metal support is then dried and fired in air or nitrogen, as by inserting the support into a furnace. The temperature is increased over a period of about one hour to a peak temperature of between about 650 to 900° C.

In an alternate method, gold dots, e.g., about 10 mil in diameter, can be screen printed onto the clean metal support substrate using a fritless gold thick film ink. This patterned gold layer is then dried, and fired in nitrogen using an appropriate thick film firing profile, to a peak temperature of about 650° C. By appropriate firing profile is meant that the temperature is raised stepwise, first to remove the organic materials in the thick film ink, and then to complete firing of the metal layer.

A fritless silver thick film ink is then screen printed onto the fired support substrate over the gold dots. This silver layer is then dried, and fired in air or nitrogen over about an hour to a peak temperature of about 650 to 900° C. to remove the organic materials and sinter the silver particles together.

In still another method, silver contact pads can be screen printed directly onto the metal support substrate using a glass-filled silver contact ink that includes a reducing agent. This ink is dried and fired in air over a one hour period to a peak temperature of about 800 to 850° C.

The resultant fired metal support substrates include contact pads which can be connected electrically to overlying multilayer printed circuits, but do not have a dielectric layer under the contacts. A bonding glass layer, such as has been disclosed by Prabhu et al in U.S. Pat. No. 5,581,876, can be deposited over the remaining portion of the support substrate, by screen printing a bonding glass ink, thereby avoiding deposits over the contacts that would interfere with the low resistance contact pads.

After the patterned silver layer has been applied to the support substrate and fired, the prepared multilayer green tape stacks, having conductive circuitry on their surface and filled conductive vias to provide electrical connections between the circuitry on the green tapes, are aligned and laminated under heat and pressure using conventional techniques. Just prior to mounting the laminated green tapes onto the support substrate, a fritless silver thick film ink is screen printed so as to deposit a fresh silver layer onto the already formed contact pads.

The invention will be further described in the following example, but the invention is not meant to be limited to the details described therein.

EXAMPLE

A silver contact ink was made by mixing 3.13 grams of silver powder, sold as "SF15"; 3.13 grams of silver powder "SFC" and 6.25 grams of silver flake "SPQ", all sold by the Degussa Company, together with 0.8 gram of amorphous boron powder, 1.5 grams of a low TCE glass comprising 28.68 grams of zinc oxide, 5.92 grams of magnesium oxide, 6.21 grams of barium oxide, 15.36 grams of alumina and 43.82 grams of silica. The inorganic materials were mixed with an organic vehicle comprising a) 0.8 gram of a resin solution containing 7.5 grams of ethyl cellulose resin having a molecular weight of 300, 55.0 grams of butyl carbitol and 37.0 grams of terpineol solvent; b) 0.8 gram of a 5% ethyl cellulose solution in terpineol; c) 1.3 gram of a 13% solution of a resin Elvacite 2045 sold by ICI Acrylics in terpineol solvent; and d) 0.2 gram of a 1:1 mixture of lecithin in terpineol. The resultant silver ink can be used to directly print silver contact pads onto the above-described support substrate. These contact pads were then fired in air for one hour at a peak temperature between about 800 and 850° C.

A green tape stack made from properly chosen glasses and a suitable organic vehicle, the green tapes screen printed with the desired circuitry and connected electrically with a silver via fill ink, was aligned and laminated under heat and pressure.

A fresh fritless silver thick film ink layer was screen printed onto the formed silver contact pads on the support substrate, and the assembled green tape stack aligned and mounted on the support substrate. The resultant assembly was fired in known manner to remove the organic materials, sinter the glass of the green tapes and/or silver ink, and adhere the green tape stack to the support substrate.

Other glasses are known that are TCE matched to other metal support substrates. For example, a green tape can be made from a Zn-Mg-borosilicate glass containing 20–40% of zinc oxide, 15–35% of magnesium oxide, 15–30% of boron oxide and 15–30% of silicon oxide, all parts by weight. This glass can be made containing about 5–8% of forsterite filler for example, and is TCE matched to a copper clad Kovar® support substrate.

Although the invention has been described with respect to directly connecting a circuit of a green tape stack to a bond pad on the surface of a support substrate, the present method can also be used to deposit a die bond pad to the metal support substrate which can be used to electrically connect a device mounted, for example, on the backside of the support substrate which is connected to ground. In such case, the fritless silver thick film screen printed to the support substrate prior to mounting the multilayer green tape stack can be changed to or made of a silver-palladium powder or other suitable metal powder. After firing, these exposed contact pads can be plated with metals such as copper, nickel or gold for example.

We claim:

1. A method of forming low resistance metal contact pads on a metal support substrate for a multilayer ceramic precursor green tape stack, said green tape comprising glass particles and an organic vehicle having circuitry printed thereon comprising forming a patterned layer of conductive metal on the unfired metal support substrate, said conductive metal made of the same metal as circuitry present on the green tape stack, and firing the patterned support.

2. A method according to claim 1 wherein the conductive metal is gold covered with silver.

3. A method according to claim 1 wherein the conductive metal is silver.

4. A method according to claim 1 wherein the conductive metal is formed by electroplating a gold layer to form a patterned layer, screen printing a silver layer over the gold pattern, and firing to a temperature of from about 650 to 900° C.

5. A method according to claim 4 wherein the electroplated layer is deposited through a mask.

6. A method according to claim 4 wherein the electroplated layer is pattern etched through a mask.

7. A method according to claim 4 wherein after firing the patterned metal support substrate, applying a thin layer of a conductive metal from a fritless ink over the patterned silver layer and laminating the patterned support substrate and the multilayer green tape stack and firing to sinter the glass in the green tape.

8. A method according to claim 2 wherein the gold layer is formed by screen printing a gold pattern using a fritless gold thick film ink and firing to a temperature of up to about 650° C. in a nitrogen atmosphere, screen printing a silver thick film ink over the fired gold pattern, and firing at a temperature of from about 650 to 900° C.

9. A method according to claim 3 wherein the screen printed patterned silver layer is deposited from a glass-containing thick film silver ink including a reducing agent to form a silver contact pad on the support substrate and firing in air at a temperature of from about 800 to 850° C.

10. A method according to claim 9 wherein after firing the patterned metal support substrate, applying a thin layer of silver from a fritless ink over the patterned silver layer and laminating the patterned support substrate and the multilayer green tape stack, and firing to sinter the glass in the green tape.

11. A method according to claim 1 wherein after firing the patterned metal support substrate, applying a thin layer of a conductive metal from a fritless ink over the patterned conductive layer and laminating the patterned support substrate and the multilayer green tape stack, and firing to sinter the glass in the green tape.

\* \* \* \* \*